(12) United States Patent
Meier et al.

(10) Patent No.: US 8,802,485 B2
(45) Date of Patent: Aug. 12, 2014

(54) METHOD FOR MANUFACTURING A PHOTOVOLTAIC CELL STRUCTURE

(75) Inventors: Johannes Meier, Corcelles (CH);
Markus Bronner, Azmoos (CH);
Markus Kupich, Buchs (CH); Tobias Roschek, Wildhaus (CH); Hanno Goldbach, Sevelen (CH)

(73) Assignee: Tel Solar AG, Trubbach (CH)

( * ) Notice: Subject to any disclaimer, the term of this patent is extended or adjusted under 35 U.S.C. 154(b) by 223 days.

(21) Appl. No.: 12/921,823

(22) PCT Filed: Sep. 7, 2009

(86) PCT No.: PCT/EP2009/061576
§ 371 (c)(1),
(2), (4) Date: Sep. 10, 2010

(87) PCT Pub. No.: WO2009/141459
PCT Pub. Date: Nov. 26, 2009

(65) Prior Publication Data
US 2011/0057276 A1   Mar. 10, 2011

(51) Int. Cl.
*H01L 31/18* (2006.01)

(52) U.S. Cl.
USPC ............ 438/96; 438/509; 438/484; 438/74; 438/87

(58) Field of Classification Search
USPC .................... 438/96, 509, 484, 74, 98, 87
See application file for complete search history.

(56) References Cited

U.S. PATENT DOCUMENTS

| | | | |
|---|---|---|---|
| 5,792,280 A | 8/1998 | Ruby et al. | |
| 6,379,994 B1 | 4/2002 | Sano et al. | |
| 6,844,265 B2 * | 1/2005 | Ouchi | 438/706 |
| 7,238,545 B2 | 7/2007 | Yoshimi et al. | |
| 2002/0050287 A1 * | 5/2002 | Yamada et al. | 136/251 |
| 2005/0194593 A1 * | 9/2005 | Ramdani et al. | 257/52 |
| 2006/0043517 A1 | 3/2006 | Sasaki et al. | |
| 2011/0223711 A1 * | 9/2011 | Ducros et al. | 438/96 |

OTHER PUBLICATIONS

Schroeder et al. "Current status of the thermo-catalytic (hot wire) CVD of thin silicon films for photovoltaic applications" Elsevier Science "The Soild state Films" No. 395 (2001) pp. 298-304.*
Loffler, et al., "Amorphous and 'Micromorph' Silicon Tandem Cells with High Open-Circuit Voltage," Solar Energy Materials and Solar Cells 87 (2005), pp. 251-259.
Rath, et al., "Effect of Oxide Treatment at the Microcrystalline Tunnel Junction of a-Si:H/A-Si:H Tandem Cells," Journal of Non-Crystalline Solids 266-269 (2000), pp. 1129-1133.
International Search Report for PCT/EP2009/061576 dated Aug. 25, 2010.
Written Opinion for PCT/EP2009/061576 dated Aug. 25, 2010.

* cited by examiner

*Primary Examiner* — Michael Shingleton
(74) *Attorney, Agent, or Firm* — Pearne & Gordon LLP

(57) ABSTRACT

In the frame of manufacturing a photovoltaic cell a layer (3) of silicon compound is deposited on a structure (1). The yet uncovered surface (3a) is treated in a predetermined oxygen ($O_2$) containing atmosphere which additionally contains a dopant (D). Thereby, the silicon compound layer is oxidized and doped in a thin surface area (5).

14 Claims, 4 Drawing Sheets

“METHOD FOR MANUFACTURING A PHOTOVOLTAIC CELL STRUCTURE”

Figure 1:
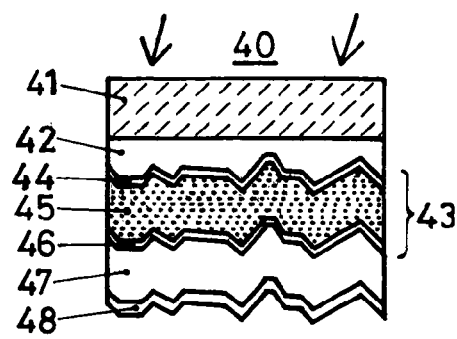

The present invention relates to a method for manufacturing a photovoltaic cell structure having two electrodes and comprising at least one layer of silicon compound.

DEFINITION

We understand throughout the present description and claims under "silicon compound" a material which comprises silicon. The material comprises further and additionally to silicon at least one element. Especially hydrogenated silicon as well as silicon carbide both with or without dopant or Silicon Germanium compounds as examples fall under this definition. Further, the addressed silicon compound may be of any material structure which is apt to be applied in photovoltaic cell structure manufacturing, may especially be of amorphous or microcrystalline material structure. We thereby understand the structure to be microcrystalline if the material structure comprises at least 10 Vol. %, preferably more than 35 Vol. % of crystallites in an amorphous matrix.

Photovoltaic solar energy conversion offers the perspective to provide for an environmentally-friendly means to generate electricity. However, at the present state, electric energy provided by photovoltaic energy conversion units is still significantly more expensive than electricity provided by conventional power stations. Therefore, the development of more cost-effective manufacturing of photovoltaic energy conversion units attracts attention in the recent years. Amongst different approaches of manufacturing low-cost solar cells, thin-film silicon solar cells combine several advantageous aspects: Firstly, thin-film silicon solar cells can be manufactured based on thin-film deposition techniques such as plasma-enhanced chemical vapor deposition (PECVD), and thus offer the perspective of synergies with known deposition techniques to reduce manufacturing costs by using experiences achieved in the past e.g. in the field of other thin-film deposition technologies, such as in the display manufacturing sector. Secondly, thin-film silicon solar cells can achieve high-energy conversion efficiencies, striving for 10% and beyond. Thirdly, the main raw materials for the manufacturing of thin-film silicon based solar cells are abundant and non-toxic.

Amongst various approaches for manufacturing thin-film silicon solar cells or solar cell structures, particularly the concept of two or multi cell stacking, also known e.g. as tandem concept, offer the perspective of achieving energy conversion efficiencies exceeding 10% due to the better exploitation of the solar irradiation spectrum compared to e.g. single cells.

DEFINITION

We understand throughout the present description and claims as a "structure" of photovoltaic cells, single photovoltaic cells in pin or nip configuration as well as structures of photovoltaic cells consisting of stacked cells in nip-nip or pin-pin configuration as tandem structures with two, or with more than two stacked cells.

Thereby, the single cells which are combined to form tandem, triple or even higher order photovoltaic cell structures do all comprise a layer of intrinsic silicon compound, as especially of intrinsic hydrogenated silicon.

DEFINITION

We perceive and define as "intrinsic silicon compound material" a silicon compound which is either doped neutrally, i.e. wherein negative doping is compensated by positive doping or vice versa, or such silicon compound which, as deposited, is undoped.

The addressed layers of intrinsic silicon compound may be of amorphous structure or of microcrystalline structure. If such intrinsic layer of a cell is amorphous, then the cell is named of amorphous type, a-Si, if the i-layer of a cell is of microcrystalline structure, the cell is named of microcrystalline type, µc-Si. In tandem and higher order cell structures all the cells may either be a-Si or µc-Si. Customarily, tandem or higher order cell structures provide the cells of mixed type, a-Si and µc-Si, to exploit the advantages of both cell types in the photovoltaic cell structure.

A thin-film photovoltaic cell structure includes a first electrode, one or more stacked cells in p-i-n or n-i-p structure and a second electrode. The electrodes are necessary to tap off electric current from the cell structure.

FIG. 1 shows a basic simple photovoltaic cell 40. It comprises a transparent substrate 41, e.g. of glass, with a layer of a transparent conductive oxide (TCO) 42 deposited thereon and acting as one of the electrodes. This layer is also called in the art "Front Contact" FC. There follow the active layers of the cell 43. The cell 43 as exemplified consists in a p-i-n structure of layer 44 which is positively doped adjacent to the TCO. The subsequent layer 45 is intrinsic and the final layer 46 is negatively doped. In an alternative embodiment the layer sequence p-i-n as described may be inverted to n-i-p. Then layer 44 is n-doped and layer 46 is p-doped.

Finally, the cell structure comprises a rear contact layer 47 also called "Back Contact", BC, which may be made of zinc oxide, tin oxide or ITO and which customarily is provided with a reflective layer 48. Alternatively, the back contact may be realized by a metal material or by a combination of TCO and metal material which may combine the physical properties of back reflector 48 and back contact 47. In FIG. 1 the arrow indicates the impinging light direction for illustrative purposes.

DEFINITION

We understand under an "active layer" of a cell the positively doped -p- layer or layer system, the layer of intrinsic silicon compound -i- which is called "photovoltaically active layer" as well as the negatively -n- doped layer or layer system.

Thus and with an eye on FIG. 1 the following prevails:
Layers 44, 45, 46 are active layers.
Layer 45 is a "photovoltaically active layer"
Layers 44, 46, are "doped active layers".

Figure 2:
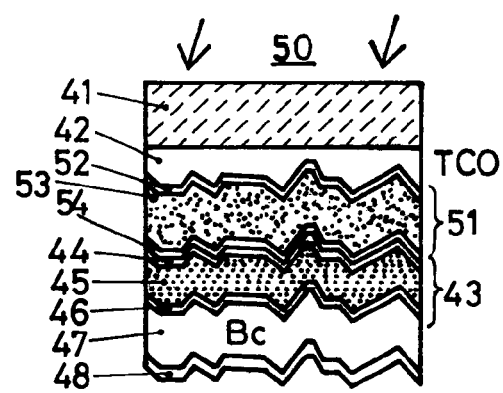

For tandem photovoltaic cell structures it is known in the art to combine an a-Si cell having sensitivities in a shorter wavelength spectrum with a µc-Si cell, which exploits the longer wavelengths of solar spectrum. However, combinations like a-Si/a-Si or µc-Si/µc-Si or others are possible for photovoltaic and especially solar cell structures. For illustrative purposes FIG. 2 shows a tandem cell structure. As in the cell of FIG. 1 it comprises a substrate 41 and, as a first electrode, a layer of transparent conductive oxide TCO 44, as was addressed also named front contact FC or front electrode. The cell structure further comprises the first cell, e.g. of hydrogenated silicon 43 which latter comprises three layers 44, 45 and 46 like the addressed layers in the embodiment of FIG. 1. There is further provided a rear contact layer 47 as a second electrode and a reflective layer 48. The properties and requirements of the structure according to FIG. 2 and as described to now have already been described in context with FIG. 1. The cell structure further comprises a second cell, e.g.

of hydrogenated silicon 51. Latter comprises three layers 52, 53, 54 which are respectively positively doped, intrinsic and negatively doped layers and which form the p-i-n structure of the second cell. The cell 51 may be located between front contact layer 42 and the cell 43 as shown in FIG. 2, but alternatively the two cells 43 and 51 may be inversed with respect to their order, resulting in a layer and cell structure 42, 43, 51, 47. Again for illustrative purposes the arrow indicates impinging light. Considered from the direction of incident light it is common to refer to the "top cell" which is closer to the incident light and "bottom cell". In the example of FIG. 2 cell 51 is thus the top cell and cell 53 the bottom cell. In such tandem cell structure customarily both, cell 43 and 51 are a-Si type or cell 51 is of a-Si type and cell 43 of μc-Si type.

In the art of manufacturing photovoltaic cell structures it is known to provide along the stack of layers areas which are oxygen enriched. E.g. J. Löffler et al., "Amorphous and micromorph silicon tandem cells with high open circuit voltage", Solar Energy Materials and Solar Cells 87 (2005) (251-259) proposes to apply air breaks between a wide gap i-layer and a μc-Si n-layer on one hand and between the addressed μc-Si n-layer and a μc-Si p-layer. By the addressed air breaks the respective uncovered surfaces are oxidized. J. K. Rath et al., "Effect of Oxide Treatment at the microcrystalline Tunnel Junction of a-Si:H/a-Si:H Tandem Cells", Journal of Non-Crystalline Solids 266-269 (2000), 1129-1133 teaches to treat the surface of a n-μc-Si:H layer by a $CO_2$ plasma before depositing subsequently a p-μc-Si:H layer.

From U.S. Pat. No. 7,238,545 it is further known to expose the surface of a doped active layer to air. Thereby obviously an oxidizing treatment is performed. After such step of air exposure the addressed surface is exposed to a plasma in a mixed atmosphere of doping gas. As a doping gas phosphorus, oxygen and the like may be used.

With an eye on the use of oxygen it must be emphasized that oxidizing a material and doping a material with oxygen are quite different appliances of the addressed oxygen. In oxidizing a material the resulting material is formed of a compound, one element thereof being oxygen. Doping is being referred to as a process of intentionally introducing impurities into material to influence its physical (e.g. electrical, optical, crystal) properties. The concentration of intentionally introduced impurities is low, less than $10^{-5}$. —in contrast to a compound comprising as a compound element, oxygen, as e.g. an oxide.

It is an object of the present invention to improve electrical and/or optical characteristics of oxidized areas wherever applied along the stack of a photovoltaic cell structure. This is achieved by a method for manufacturing a photovoltaic cell structure which has two electrodes and which comprises—among other layers—at least one layer of silicon compound. The method comprises deposition of the addressed one silicon compound layer in a vacuum upon a carrier structure for the addressed one silicon compound layer. This results in one surface of the silicon compound layer resting on the carrier structure, whereas a second surface of the silicon compound layer is uncovered. Then the method comprises treating the second uncovered surface of the silicon compound in a predetermined oxygen containing atmosphere which oxygen containing atmosphere comprises a dopant gas. Thereby, the addressed surface of the silicon compound layer is oxidized and is in the same processing step additionally enriched with a dopant. Alternatively, there is applied to the addressed uncovered surface in a vacuum atmosphere a layer of at most 2 nm thickness of a doped oxide. Subsequently there is deposited upon the addressed second surface having been treated or to which the oxide layer has been applied a further layer.

DEFINITION

We understand throughout the present description and claims under treating a surface in a predetermined oxygen and a dopant gas containing atmosphere that the addressed surface to be treated is not covered additionally with a solid material, but its surface area is transformed to an oxide which is doped. In opposition thereto, we understand under applying a doped oxide to the addressed surface that an additional solid material layer of the addressed doped oxide is deposited upon such surface.

By performing the addressed oxidizing treatment combined with doping or applying the addressed thin oxide layer which is doped, the significant advantage is most generically achieved that by means of the controllability of the doping the electrical and/or optical characteristics which result from the addressed treating or layer deposition may most accurately be adjusted according to the respective requirements and dependent from the fact where along the stack of layers of the cell structure such doped oxidizing or doped oxide layer is applied.

In one embodiment of the method according to the present invention, which may be combined with any of the subsequently addressed embodiments, there is performed a step of ambient air exposing the second surface before and/or after having been treated or having been covered by the thin oxide layer. Thereby, it becomes possible to substantially improve reproducibility of the photovoltaic cell structure in spite of the uncontrollable step of ambient air exposure, the effect of which upon the manufactured photovoltaic cell structure being dependent upon uncontrollable ambient air atmosphere parameters, as e.g. pressure, humidity and temperature.

In a today preferred embodiment of the method according to the invention, which may be combined with any of the preceding and of the succeeding embodiments, unless mutually excluding, a dopant which is different from oxygen is used. Thereby, today preferred for negative doping, phosphorus is used or, for positive doping, boron.

In spite of the fact that it is absolutely possible to select as the further layer a layer which is not of a silicon compound, in most cases and according to a further embodiment of the invention, which may be combined with any of the preceding or succeeding embodiments, if not mutually excluding, the further layer is selected to be of a silicon compound.

DEFINITION

A material may be doped positively (p) or negatively (n). Throughout the present description and claims we address these two possibilities as "types of doping".

In a further embodiment of the method according to the invention, which may be combined with any of the preceding and succeeding embodiments, unless mutually excluding, the one layer with the addressed second surface is of a doped silicon compound.

It has further been recognized that one embodiment of the present invention is highly advantageous, which may be combined with any previously or subsequently addressed embodiments, unless mutually excluding, namely the embodiment according to which the addressed layer of doped silicon compound is first type doped and the dopant applied in the treatment step or the step of depositing the thin oxide layer is of first type as well.

In a further embodiment of the method according to the invention, which may be combined with any of the previously and subsequently addressed embodiments, unless mutually excluding, the one silicon compound layer with the addressed uncovered surface is formed by a doped layer which is at least a part of a doped active layer. Thereby, it is known to realize one or both of the doped active layers by a stack of two or even more equal type doped sub-layers. One of these sub-layers may e.g. be of amorphous material structure as e.g. of amorphous hydrogenated silicon, a subsequent sub-layer of microcrystalline material structure as of microcrystalline hydrogenated silicon. It has been recognized that it is often advantageous to apply the treatment or deposition of the thin oxide layer according to the present invention between succeeding sub-layers and/or atop of the doped active layers.

In a further embodiment, which may be combined with any of the previously and subsequently addressed embodiments unless mutually excluding, the one layer with the addressed uncovered second surface is of microcrystalline silicon compound. This is especially advantageous if the addressed microcrystalline silicon compound layer is at least a part of the photovoltaically active layer.

In a further embodiment of the invention, which may be combined with any of the previously and of the succeedingly addressed embodiments, unless mutually excluding, the one layer with the addressed uncovered surface is of amorphous silicon compound. This embodiment is thereby especially advantageous if the addressed one layer is at least a part of a doped active layer.

In a further embodiment of the method according to the invention, which may be combined with any of the previously and of the succeedingly addressed embodiments, unless mutually excluding, the one layer with the addressed uncovered second surface is first type doped and the further layer is a second type doped layer. This sequence of the one and of the further layer is customarily present when stacking more than one cell one upon the other in the cell structure. Thereby, it is highly advantageous to apply the treatment according to the invention or to apply the thin oxide layer according to the invention in between these two layers.

Thus, and in a further embodiment of the just addressed embodiment the one layer is at least a part of the doped active layer of one cell and the further layer is at least a part of the doped active layer of a second cell, stacked upon the first one.

In a further embodiment of the method according to the invention, which may be combined with any of the previously and of the succeedingly addressed embodiments, unless mutually excluding, the treatment mode as to practice the present invention, is at least initiated before the deposition of the one silicon compound layer is terminated. Thus, before the addressed deposition of the one silicon compound layer is terminated one starts to establish in the surrounding during deposition of the one silicon compound layer establishing the predetermined oxygen and dopant gas containing atmosphere. If e.g. the addressed deposited one layer is deposited by a PECVD or CVD process, e.g. a layer of hydrogenated silicon making use of silane gas, before terminating the addressed deposition, oxygen and the addressed dopant gas is fed to the processing atmosphere e.g. in a steadily or steplike increasing amount so that the last few nm of the addressed one layer become oxidized and doped in a gradually increasing manner. Once the desired thickness of the addressed one layer is reached, the deposition of hydrogenated silicon is stopped by stopping the inflow of silane and, if necessary and desired, the resulting surface is further exposed to the atmosphere containing oxygen and dopant gas.

In a further embodiment, which may be combined with any of the formerly or subsequently addressed embodiments, if not mutually excluding, the treatment as one possibility of practicing the present invention is initiated after or at termination of the deposition of the one silicon compound layer.

In a further embodiment of the invention, which may be combined with any of the previously and of the succeedingly addressed embodiments, unless mutually excluding, the treatment as one possibility of practicing the present invention is performed by exposing the second surface to a predetermined atmosphere containing oxygen during a first time span and to a predetermined atmosphere containing the dopant gas during a second time span.

Thereby and as a further embodiment of the just addressed embodiment the first and second time spans are selected to be different and non-overlapping or different and overlapping or equal and non-overlapping or equal and partially overlapping or equal and completely overlapping.

By selecting one of the addressed possibilities, different controllabilities of oxidizing and of doping may be exploited according to the respective needs for a specific application of the treatment according to the invention.

In a further embodiment of the invention, which may be combined with any previously and subsequently addressed embodiment, unless mutually excluding, the oxide layer according to one form of practicing the present invention is deposited by depositing the oxide layer during a first time span and doping the oxide of the oxide layer during a second time span. In view of optimal controllability on one hand of oxide layer formation and on the other hand of doping, in a further embodiment the time spans are selected to be different and non-overlapping or different and overlapping or equal and non-overlapping or equal and partially overlapping or equal and completely overlapping.

In a further embodiment, which may be combined with any of the previously and of the subsequently addressed embodiments, unless mutually excluding, the treatment as one mode of practicing the invention is performed by a stream of a gas which contains at least the oxygen.

In a further embodiment of the invention, which may be combined with any of the previously and of the subsequently addressed embodiments, unless mutually excluding, the treatment as one mode of practicing the invention is performed by exposing the surface to a thermocatalytic process with oxygen containing radicals and a dopant.

In one embodiment of the invention, which is today preferred and which may be combined with any of the previously and of the succeedingly addressed embodiments, unless mutually excluding, the treatment as one mode of practicing the invention is performed by activating the gas of the atmosphere containing oxygen and a dopant by a plasma discharge. Thereby, and in a today preferred embodiment, the addressed gas of the atmosphere contains predominantly $CO_2$.

In a further today preferred embodiment of the method according to the invention, which may be combined with any of the previously and subsequently addressed embodiments, unless mutually excluding, at least two of depositing the one layer of silicon compound, of treating the uncovered surface or depositing the doped oxide layer respectively and of depositing the further layer are performed in one and the same vacuum chamber.

The present invention is further directed on a photovoltaic cell structure which comprises a silicon compound layer on a carrier arrangement and further comprises in and/or upon said layer an area of doped oxide considered in direction of thickness extent of the layer. Thereby, such structure results in one embodiment from a manufacturing method as was addressed above.

Figure 3:
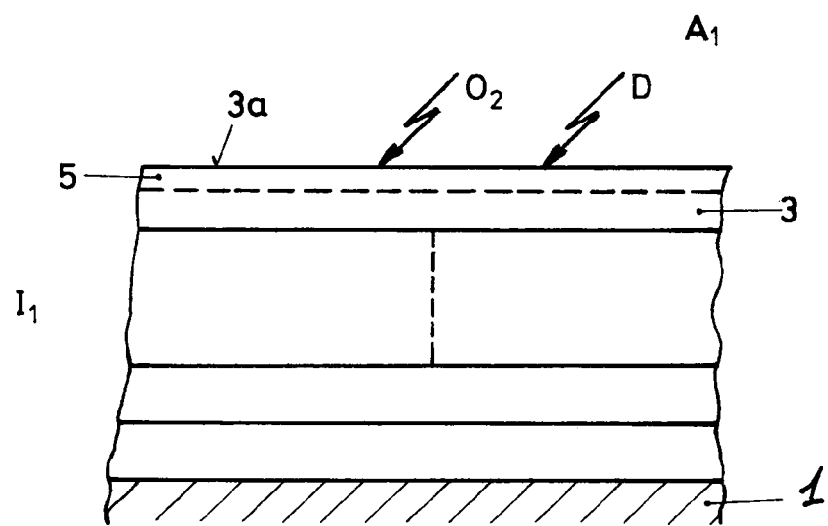
Figure 4:
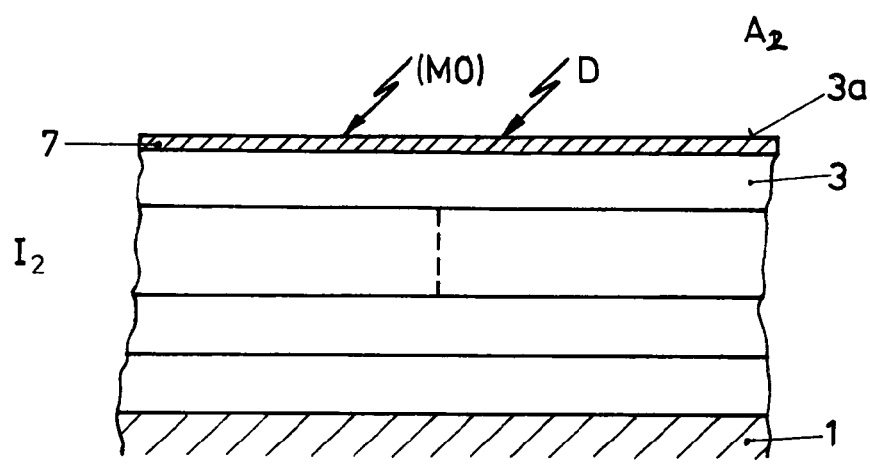
Figure 5:
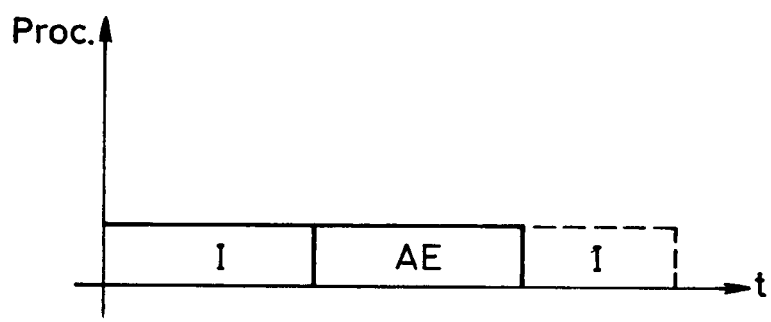
Figure 6:
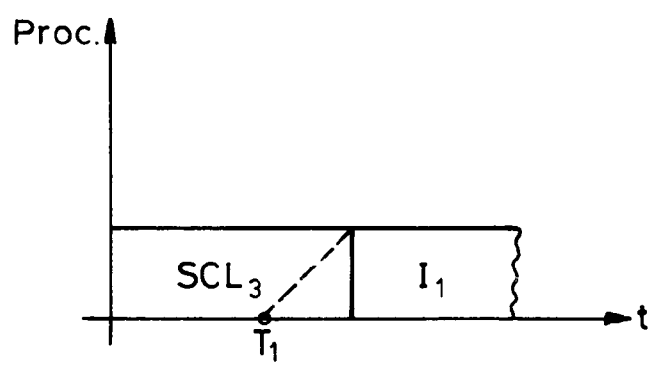
Figure 7:
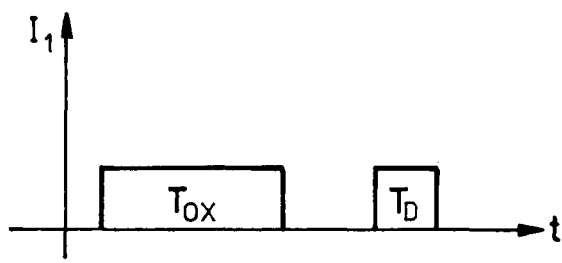
Figure 8:
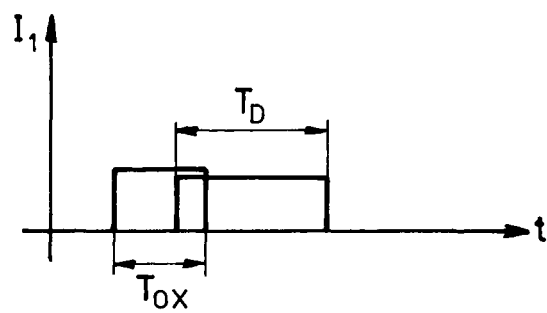
Figure 9:
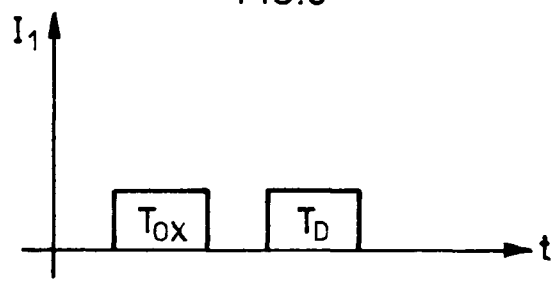
Figure 10:
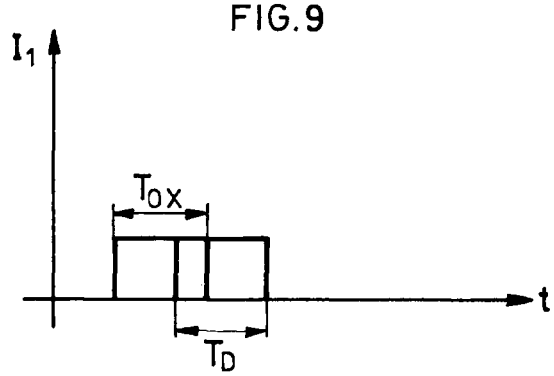
Figure 11:
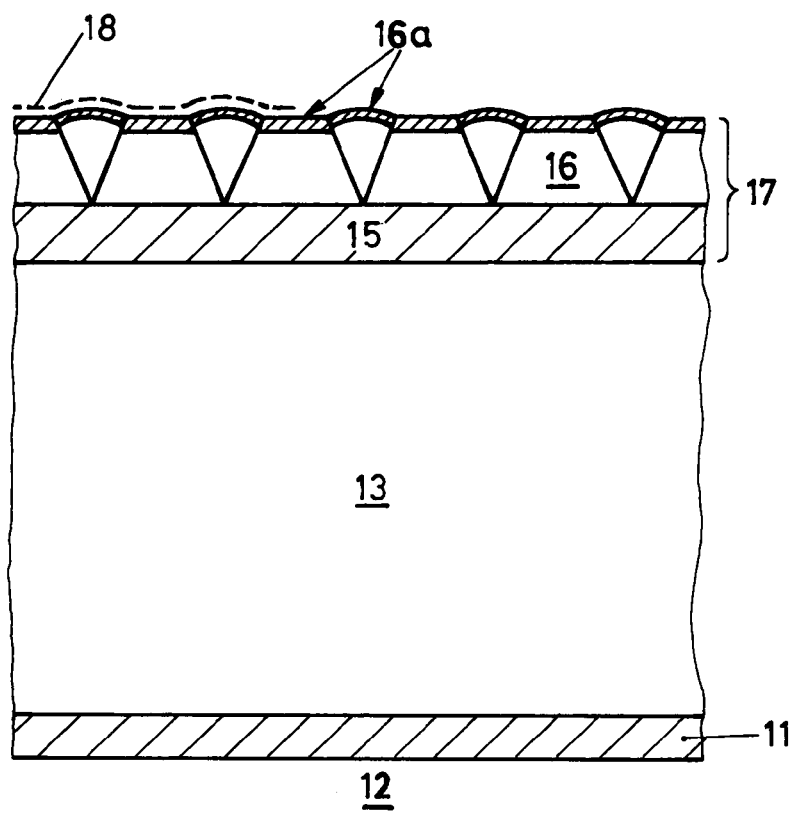

The invention shall now be further exemplified with the help of figures. The figures show:

FIG. 1 schematically, the structure of a photovoltaic cell as one example of a prior art photovoltaic cell structure;

FIG. 2 a second example of a prior art photovoltaic cell structure, namely of tandem cell structure;

FIG. 3 most schematically, a part of a photovoltaic cell structure as manufactured according to the invention processed in one mode of practicing the invention;

FIG. 4 in a representation according to that of FIG. 3, a further embodiment of a part of a photovoltaic cell structure according to the invention and manufactured according to a second mode of practicing the present invention;

FIG. 5 schematically over a time axis, the sequence of layer processing according to the invention and of ambient air exposure;

FIG. 6 over a time axis, the sequence of depositing a silicon compound layer during manufacturing of a photovoltaic cell structure according to the invention and initiating a treatment according to the invention before terminating deposition of the silicon compound layer;

FIGS. 7-10 four examples of tailoring and time staggering oxidizing and doping according to the present invention, and FIG. 11 schematically, a part of a photovoltaic cell structure according to the invention, whereat the surface of a microcrystalline hydrogenated silicon layer is processed according to the present invention.

FIG. 3 most schematically shows a first mode to practice the manufacturing method according to the present invention. After having deposited, as by a CVD or a PECVD layer deposition process, one or more than one layer for a photovoltaic cell structure upon a carrier structure 1 a layer of silicon compound 3 is deposited. The yet uncovered surface 3a is then treated in a predetermined oxygen containing atmosphere which additionally contains a dopant gas. This is schematically shown by the arrows addressed by $O_2$ and D which schematically show the exposure of the surface 3a to the atmosphere $A_1$ comprising the oxygen $O_2$ and the dopant D. Thereby, the silicon compound layer 3 is oxidized and doped in a thin surface area 5 having a thickness of a few Å up to a few nm. This mode of practicing the invention is addressed by $I_1$.

After having treated the surface 3a of silicon compound layer 3a further layer (not shown) is deposited on the yet treated surface 3a with thin surface area 5. The surface area 5 in fact consists of oxidized silicon compound which is additionally doped by the dopant D.

With the help of FIG. 4 the second mode of practicing the method for manufacturing according to the present invention shall schematically be shown based on a representation in analogy to that of FIG. 3.

According to FIG. 4 the surface 3a of the layer 3 of silicon compound is coated with a thin oxide layer 7 being of oxide MO which is doped with a dopant D. Thus, and in opposition to practicing the invention according to FIG. 3, there is added upon the surface 3a of silicon compound 3 a layer 7 of additional solid material. The thickness of the oxide layer 7 is thereby between few Å to at most 2 nm.

We address this mode of practicing the manufacturing method according to the invention as $I_2$. If during the following description we want to commonly address the one mode $I_1$ as well as the second mode $I_2$ we address this by referring to processing I.

The atmosphere from which, according to $I_2$, the surface 3a of silicon compound layer 3 is coated with the thin oxide layer 7 is denoted in FIG. 4 by $A_2$. As a dopant D in processing I any of the known dopants may be exploited, thereby clearly depending on whether positive or negative doping shall be applied. Nevertheless, for negative doping phosphorus has revealed to be highly suitable.

Additionally, it should be considered that oxygen does also act as a negative dopant. As an example this may e.g. be performed in processing $I_1$ by first oxidizing the silicon compound layer 3 and thereby generating the surface area 5 purely of oxide of the silicon compound and then to apply the dopant D. The same processing may be applied when using a dopant D in the process $I_2$ in that first a thin material oxide layer 7 is deposited which is afterwards doped.

As perfectly known to the skilled artisan it is often desired during subsequent layer depositions for manufacturing a photovoltaic cell structure, to expose an intermediate product, i.e. a surface of a layer of the structure built up yet, to ambient air. Thereby, ambient air is a rather uncontrolled processing atmosphere, as especially pressure and temperature may significantly vary. This may lead to a bad reproducibility of the addressed photovoltaic cell structures manufactured. Thereby, it has been recognized that such uncontrollable influence from ambient air exposure may be avoided by performing processing I before and/or after performing ambient air exposure.

FIG. 5 schematically shows over the time axis the processing sequence upon the surface 3a of the silicon compound layer 3 if ambient air exposing is desired before depositing a further layer. Thereby, the addressed surface 3a is first treated by processing I and then exposed to ambient air which is shown in FIG. 3 by the processing cycle AE and is then possibly again exposed to processing I. Nevertheless, in some cases it may be preferred to omit the first processing step I and to perform such processing step I only after the ambient air exposure step AE. In still other cases it might be preferred to perform a processing I before and after ambient air exposure AE. Thereby, the specific conception of the processing I may selectively be different, dependent on the fact whether it is applied before or after ambient air exposure. Thus, e.g. processing I before ambient air exposure may be performed according to processing $I_1$, and processing I after ambient air exposure may be performed by processing $I_2$ or vice versa. Additionally, processing parameters and processing techniques which will be addressed later may be different, depending on whether processing I is applied before and/or after ambient air exposure.

In spite of the fact that in some cases it might be desirable to apply the addressed processing I on surface 3a and then deposit a non-silicon compound layer as e.g. a back contact layer as was addressed at 47 of FIG. 1, e.g. of zinc oxide, tin oxide or ITO, such processing I is often applied before a further layer of a silicon compound is deposited on layer 3. Thereby, such further layer will often be made of doped silicon compound. Thereby and as will be exemplified in a specific example as of FIG. 11 and irrespective of what material the further layer deposited upon layer 3 is made of, the case often arises where layer 3 of silicon compound is first type doped, e.g. negatively doped. In such a case processing I will often be performed making use of a first type dopant, i.e. in the example, also of a negative dopant. The dopants, both of first type in layer 3 as well as for performing processing I, may be same or different. Especially for negative doping in this addressed case the use of phosphorus as dopant D for processing I has shown up to be most favorable.

Often the one silicon compound layer 3 is a doped layer which is at least a part of a doped active layer system, i.e. a layer which is at least a sub-layer of the p- or of the n-doped active layer of a cell structure. In this case and especially if there is a further cell stacked upon the first cell addressed to form a tandem or multiple cell photovoltaic cell structure, the addressed processing I is applied between the subsequent doped active layers of such nip-nip or pin-pin structure.

Thereby, in some cases and especially if the addressed layer 3 of silicon compound is at least a part of the doped active layer of a cell structure as was addressed, layer 3 will be of microcrystalline silicon compound as especially from microcrystalline hydrogenated silicon. This especially then, if a μc-Si cell comprises the layer 3.

Nevertheless, it is also known to provide at the transition between an a-Si cell and a μc-Si cell or at the transition between an a-Si and an a-Si cell, at least one layer of microcrystalline silicon compound. This to improve electrically and/or optically the addressed transition area. It has been shown that in this case too it is highly advantageous to expose the surface of the addressed layer of microcrystalline silicon compound as e.g. of microcrystalline hydrogenated silicon, irrespective whether such layer is doped or not doped, to processing I so as to even further improve electrical and/or optical characteristics. Thereby, due to applying a dopant for processing I an additional parameter is exploited to optimize the addressed characteristics.

Nevertheless, in some cases the layer 3 of silicon compound is of amorphous material structure. This is e.g. the case if the addressed layer 3 of silicon compound is one of the doped active layers of a cell structure, as especially of an a-Si cell structure. If then the further layer to be applied upon layer 3 is at least a part of the doped active layer of a subsequently stacked a-Si or μc-Si single cell, processing I the layer 3 before depositing the further layer may result in the fact that introducing a layer of microcrystalline silicon compound to improve optical and/or electrical characteristics at the transition area from one cell to the other may be omitted.

Somehow more generic, whenever in the course of manufacturing the photovoltaic cell structure there has to be applied a second type doped layer upon a first type doped layer, it is highly advantageous to process by the process I according to the invention the surface of one of the addressed layers, before depositing the second layer thereupon.

As was already addressed, this case does arise when cells are stacked one upon the other in that the addressed one and further layer respectively form at least part of a doped active layer of the respective cells stacked upon each other.

With an eye on processing $I_1$ and according to the schematic representation in FIG. 6, such processing may already be initiated, as shown in dashed line over the time axis t, before the step of depositing the silicon compound layer 3 is terminated. This latter step is schematically addressed in FIG. 6 by $SCL_3$.

If e.g. layer 3 is deposited as a hydrogenated silicon layer by means of a CVD or PECVD process, this is e.g. realized by starting at a point in time $T_1$ adding oxygen to the silane atmosphere, thereby simultaneously or deferred starting adding the dopant D as of FIG. 3.

In other case it may be preferred to clearly separate the deposition step $SCL_3$ from processing $I_1$.

When looking generically upon processing $I_1$ one may consider a first time span during which oxygen is applied to the surface 3a, resulting in an oxidized surface area 5 and a second time span during which the dopant D as of FIG. 3 is applied. Addressing the time span for oxidizing as $T_{ox}$ and the time span for doping as $T_D$, according to FIG. 7 as an example, these time spans may be different and non-overlapping. According to the representation of FIG. 8 alternatively these time spans $T_{ox}$ and $T_D$ may be different and overlapping.

Still alternatively and as shown in FIG. 9 the time spans $T_{ox}$ and $T_D$ may be equal and non-overlapping. Thereby, it must be emphasized that the time span $T_{ox}$ need not be separated by intermediate time gaps.

Further and according to FIG. 10 the equal time spans $T_{ox}$ and $T_D$ may overlap partly or (not shown) may be equal and completely overlapping.

It further must be emphasized that the sequence of applying the oxidizing and the doping may be selected inversely to the sequence shown in the FIGS. 7-10, thus first applying doping and then oxidizing.

With an eye on processing $I_2$ according to FIG. 4 here too one may consider depositing an oxide material during a first time span and applying doping to the oxide material during a second time span. In this case and with respect to the respective time span for applying the oxide material $T'_{ox}$ and the time span for applying the doping $T'_D$, the same sequences and relative extents of such time spans may be applied as were exemplified with respect to processing $I_1$ with the help of the FIGS. 7-10.

For the following description the carrier structure upon which the one silicon compound layer 3 is already deposited, the surface 3a of which having to be processed I, is named "workpiece". We now address different possibilities to perform processing $I_1$.

a) Treatment in Oxygen Containing Atmosphere which is Heated

The workpiece—surface 3a—is thereby exposed to an atmosphere containing oxygen as e.g. air, pure oxygen, a nitrogen/oxygen gas mixture, $H_2O$ or a gas mixture containing other organic or oxygen containing compounds in the vacuum atmosphere. The temperature is kept between 50° C. and 300° C., thereby preferably further heated up to 100° C. to 200° C. The duration of such treatment is between 1 h and 10 h. With an eye on such relatively long duration of the treatment, such a treatment may be preformed under vacuum in an intermediate buffer station of an overall manufacturing plant. Establishing therein treatment of large batches of workpieces easily compensates for relatively long treatment time spans. The exposure of the workpieces can thereby be defined by the product E of exposure time (minutes) and temperature (degrees in C). We call this value E "exposure rate" and it has to be kept essentially on values between 5,000 and 30,000. If during the exposure time the temperature varies, the exposure rate E may be calculated by the time integral of the temperature course.

As dopant D (FIG. 3) there is added e.g. Li, Te, Mg, P, As, Sb, Bi or B, Al, Ga, In, respectively.

b) Gas Stream Processing

A further possibility to perform the addressed processing $I_1$ upon the workpieces is by a hot oxidizing gas stream. This may be realized in vacuum by exposing the workpiece to a gas flow along its surface, possibly combined with heating up the workpiece. Thereby, doping with a dopant as e.g. from arsine, bortrichloride, bortrifluoride, diborane, phosphine may be performed. This either by admixing the dopant gas to the gas stream or establishing the gas stream in an atmosphere which more stationarily comprises the addressed dopant gas.

c) Exposing to Oxygen Radicals

A further possibility to perform the addressed treatment $I_1$ of the workpiece surface is to expose the addressed surface to an atmosphere in which the formation of oxygen containing radicals is enhanced by adding a source of oxygen containing radicals, e.g. a catalyst, as known to the skilled artisan in the setup of thermocatalytic deposition systems as used in so-called "hot-wire-reactors". Here a gas mixture containing organic or oxygen containing compounds is catalytically decomposed on the surface of a catalyst and/or by secondary reaction in the gas phase.

The dopant D according to FIG. 3 is thereby added to the atmosphere. In this case e.g. again the following doping gases may be applied: Li, Te, Mg, P, As, Sb, Bi or B, Al, Ga, In, respectively.

d) Exposing to an Atmosphere with a Plasma Discharge

A further possibility which is today clearly preferred is to perform the addressed treatment $I_1$ by exposing the workpiece with its surface to an oxygen containing atmosphere, wherein there is generated a plasma discharge. Thereby, there is established in the respective processing chamber an atmosphere containing a gas or gas mixture which acts as a source of oxygen radicals, e.g. $O_2$, $H_2O$ or any gas mixture containing other organic or oxygen containing compounds, thereby today preferred $CO_2$. Thereby, as known from PVD or PECVD art the plasma discharge can be realized as an RF-, HF-, VHF- or DC-discharge, e.g. by a microwave discharge. Such processing step can be performed e.g. in the same processing chamber as the layer 3 to be treated of the workpiece was deposited. The pressure of the atmosphere for such plasma enhanced treatment is selected in the range between 0.01 and 100 mbar, thereby preferably between 0.1 and 2 mbar. The power density of the plasma is selected to be low, between 5 and 2,500 mW/cm$^2$ (relative to the electrode area, thereby preferably between 15 and 100 mW/cm$^2$. The treatment is preferably tailored in a manner that the workpiece temperature may be kept to that value which it reaches just at the end of the deposition of the silicon compound layer 3 to be treated. Thereby, heat up or cool down cycles may be avoided. The processing or treatment time is thereby short and may vary between 2 sec. and 600 sec. Such time is today thereby preferably set to last between 2 and 60 sec. Thereby, in a good embodiment in view of overall manufacturing and throughput, the addressed surface treatment $I_1$ is performed in the same process chamber in which the treated silicon compound layer 3 has been deposited. If, as today preferred, the plasma discharge and thus the treatment is performed in a predominantly $CO_2$ containing atmosphere, gas is fed to the treatment chamber at a rate of 0.05 to 50 standard liter/minute and per m$^2$ electrode area, thereby today preferred at 0.1 to 5 standard liter/minute and per m$^2$ electrode area. The plasma ignited in the addressed atmosphere will release oxygen from the carbon dioxide, resulting essentially in carbon monoxide and oxygen radicals. The oxygen radicals interact with the silicon compound surface to be treated. Making use of a predominantly $CO_2$ containing atmosphere, a very short treatment of 2 sec. to at most 2 min. is sufficient, today preferred of between 2 and 30 sec. With this atmosphere the plasma energy is set to a level between 15 and 100 mW/cm$^2$, today preferred between 25 and 50 mW/cm$^2$ electrode surface.

In this processing technique the dopant gas as e.g. arsine, bortrichloride, bortrifluoride, diborane, phosphine, thereby for n-dopant, preferably a phosphorus containing gas, is applied into the atmosphere wherein the plasma discharge is generated.

The processing I in its second mode of practicing, namely by depositing a thin oxide layer which is doped, is performed by any of the known PVD or CVD or PECVD layer deposition processes. Thereby, clearly such deposition process will be adapted best possible to the deposition processes which are exploited especially for depositing layer 3 and the further layer to be deposited upon its surface 3a.

The following oxide may be applied: $Si_xO_y$. As a dopant again the following dopants may be used depending on the fact whether positive or negative doping is intended, e.g. Li, Sb, P, As, Bi, Te, Mg as n-dopants and B, Al, Ga, In as p-dopants.

It may generically be said that the present invention is most advantageously performed in that at least two subsequent steps of depositing layer 3, treating surface 3a by process I and depositing a further layer upon surface 3a after having been processed by process I are performed in one and the same vacuum chamber as transport time do always reduce throughput.

There is thus realized in the frame of the present invention a photovoltaic cell structure which comprises a silicon compound layer 3 on a carrier for this layer 3, whereat in and/or upon the layer 3 there is present an area of a doped oxide considered in the direction of thickness of the layer 3. Such a structure is thereby manufactured by processing I.

FIG. 11 schematically shows an a-Si cell structure in pin configuration which is a part of an a-Si/a-Si or a-Si/μc-Si tandem or higher order cell. The a-Si cell comprises a p-doped active layer 11 on carrier 12 of amorphous silicon compound, thereby predominantly of hydrogenated silicon. The subsequent layer 13 is intrinsic—the photovoltaically active layer—and of amorphous silicon compound material, preferably of amorphous hydrogenated silicon. The subsequent layer 15 is a sub-layer of the second doped active layer system 17 of the a-Si cell which is n-doped. The sub-layer 15 is of amorphous structure, of silicon compound, thereby preferably predominantly of hydrogenated silicon. The subsequent layer 16 is a second sub-layer of the doped active layer system 17. Layer 16 is of microcrystalline silicon compound, thereby preferred at least predominantly of hydrogenated silicon. This layer 16 accords with layer 3 of FIG. 1.

As addressed by reference no. 16a, the upper surface of layer 16 is treated according to the present invention $I_1$ and as today preferred by the addressed exposure to $CO_2$ atmosphere, wherein a plasma discharge is generated. Instead of performing the addressed treatment $I_1$, it is possible, as was already addressed, to apply a thin oxide layer upon the surface 16a of few Å up to 2 nm, $I_2$, as shown in dash line at 18.

As not shown in FIG. 11, there is subsequently deposited upon surface 16a, the first doped active layer or sub-layer of the second subsequent cell which further layer may be of amorphous silicon compound or of microcrystalline silicon compound, thereby preferably and at least predominantly of hydrogenated silicon, which is p-doped.

As a dopant D phosphorus was added to the $CO_2$ atmosphere during the treatment $I_1$. As phosphorus containing source gas, phosphine was added, but similar compounds may also be used. Typically the dopant gas was applied with a carrier gas namely hydrogen, but other carrier gas may also be used as e.g. argon, helium or other suitable gases or gas mixtures. Today a mixing ratio of phosphine gas and $CO_2$ was selected to be between 1:1,000 and 1:10, today preferred between 1:100 and 1:10. By applying the treatment step $I_1$ as specified, there resulted a surface treatment with a thickness of a few Å to a few nm.

What is claimed is:

1. A method for manufacturing a photovoltaic cell structure comprising two electrodes and at least one silicon compound layer, comprising
   a) depositing, in a first vacuum chamber, said silicon compound layer upon a carrier structure for said silicon compound layer, resulting in a first surface of said silicon compound layer resting on said carrier structure and a second surface of said silicon compound layer, the second surface not being covered with a precursor;

b) treating, in said first vacuum chamber, said uncovered second surface of said silicon compound layer by oxidizing said second surface in a predetermined oxygen- and dopant-gas-containing atmosphere, thereby enriching said second surface of said silicon compound layer with a dopant, the oxidation of said second surface being performed to avoid uncontrollable influences from subsequent ambient air exposure;

c) moving said photovoltaic cell structure comprising said treated second surface from said first vacuum chamber to a second vacuum chamber through said ambient air; and d) depositing, in the second vacuum chamber, a further layer upon said second surface of said moved photovoltaic cell structure.

2. The method of claim 1, wherein said further layer comprises a silicon compound.

3. The method of claim 1, wherein said silicon compound layer comprises a doped silicon compound.

4. The method of claim 1, wherein said silicon compound layer comprises a doped layer which is at least a part of a doped active layer.

5. The method of claim 4, wherein said doped layer comprises one of a microcrystalline silicon compound or an amorphous silicon compound.

6. The method of claim 4, wherein said silicon compound layer is a first type doped layer and said further layer is a second type doped layer.

7. The method of claim 6, wherein said silicon compound layer is at least a part of a doped active layer of a first cell and said further layer is at least a part of a doped active layer of a second cell.

8. The method of claim 1, further comprising initiating said treating of said second surface of said silicon compound layer before terminating said depositing of said silicon compound layer.

9. The method of claim 1, further comprising initiating said treating of said second surface of said silicon compound layer after terminating said depositing of said silicon compound layer.

10. The method of claim 1, further comprising exposing said second surface of said silicon compound layer to ambient air before said treating said second surface of said silicon compound layer.

11. The method of claim 1, wherein said dopant is different from oxygen and said dopant is one of phosphorus or boron.

12. The method of claim 1, wherein said treating of said second surface comprises activating gas of said atmosphere by a plasma discharge.

13. A method for manufacturing a photovoltaic cell structure comprising two electrodes and at least one silicon compound layer, comprising a) depositing, in a vacuum chamber, said silicon compound layer upon a carrier structure for said silicon compound layer, resulting in a first surface of said silicon compound layer resting on said carrier structure and a second surface of said silicon compound layer, the second surface not being covered additionally with solid material;

b) treating, in said vacuum chamber, said uncovered second surface of said silicon compound layer by oxidizing said second surface in a predetermined oxygen- and dopant-gas-containing atmosphere, thereby enriching said second surface of said silicon compound layer with a dopant, the oxidation of said second surface being performed to avoid uncontrollable influences from subsequent ambient air exposure;

c) removing said photovoltaic cell structure comprising said treated second surface from said predetermined oxygen- and dopant-gas-containing atmosphere into said ambient air; and d) depositing a further layer upon said second surface of said removed photovoltaic cell structure.

14. A method for manufacturing a photovoltaic cell structure comprising two electrodes and at least one silicon compound layer, comprising a) depositing, in a vacuum chamber, said silicon compound layer upon a carrier structure for said silicon compound layer, resulting in a first surface of said silicon compound layer resting on said carrier structure and a second surface of said silicon compound layer, the second surface being uncovered;

b) treating, in said vacuum chamber, said uncovered second surface of said silicon compound layer by oxidizing said second surface in a predetermined oxygen- and dopant-gas-containing atmosphere, thereby enriching said second surface of said silicon compound layer with a dopant, the oxidation of said second surface being performed to avoid uncontrollable influences from subsequent ambient air exposure;

c) exposing said treated second surface to said ambient air; and d) depositing upon said exposed second surface a further layer.

* * * * *

UNITED STATES PATENT AND TRADEMARK OFFICE
CERTIFICATE OF CORRECTION

PATENT NO. : 8,802,485 B2
APPLICATION NO. : 12/921823
DATED : August 12, 2014
INVENTOR(S) : Johannes Meier et al.

Page 1 of 1

It is certified that error appears in the above-identified patent and that said Letters Patent is hereby corrected as shown below:

In the Specification,

Column 7, line 44, please replace "3a" with -- 3 a --

Signed and Sealed this
Twenty-fifth Day of November, 2014

Michelle K. Lee
*Deputy Director of the United States Patent and Trademark Office*